US009376753B2

(12) United States Patent
van Stralen et al.

(10) Patent No.: US 9,376,753 B2
(45) Date of Patent: Jun. 28, 2016

(54) APPARATUS FOR PERFORMING A PLASMA CHEMICAL VAPOUR DEPOSITION PROCESS

(71) Applicant: Draka Comteq B.V., Eindhoven (NL)

(72) Inventors: Mattheus Jacobus Nicolaas van Stralen, Eindhoven (NL); Igor Milicevic, Eindhoven (NL); Johannes Antoon Hartsuiker, Eindhoven (NL)

(73) Assignee: Draka Comteq B.V., Delft (NL)

( * ) Notice: Subject to any disclaimer, the term of this patent is extended or adjusted under 35 U.S.C. 154(b) by 268 days.

(21) Appl. No.: 13/672,706

(22) Filed: Nov. 9, 2012

(65) Prior Publication Data

US 2013/0125817 A1   May 23, 2013

(30) Foreign Application Priority Data

Nov. 17, 2011   (NL) ..................................... 2007809

(51) Int. Cl.
| C23C 16/00 | (2006.01) |
| C23F 1/00 | (2006.01) |
| H01L 21/306 | (2006.01) |
| C23C 16/511 | (2006.01) |
| C03B 37/018 | (2006.01) |
| H01J 37/32 | (2006.01) |

(52) U.S. Cl.
CPC ............ *C23C 16/511* (2013.01); *C03B 37/0183* (2013.01); *H01J 37/32229* (2013.01); *H01J 37/32256* (2013.01)

(58) Field of Classification Search
USPC ................ 118/723 MW; 156/345.35, 345.36, 156/345.41
See application file for complete search history.

(56) References Cited

U.S. PATENT DOCUMENTS

| 4,125,389 A | 11/1978 | King |
| 5,037,666 A * | 8/1991 | Mori .............................. 427/575 |
| 6,198,224 B1 * | 3/2001 | Spitzl et al. .............. 315/111.21 |
| 6,260,510 B1 * | 7/2001 | Breuls et al. .......... 118/723 MW |
| 6,706,141 B1 * | 3/2004 | Steinhardt et al. ....... 156/345.41 |
| 6,849,307 B2 | 2/2005 | Breuls et al. |
| 7,975,646 B2 | 7/2011 | Rius et al. |
| 8,662,011 B2 | 3/2014 | van Stralen |

(Continued)

FOREIGN PATENT DOCUMENTS

| CN | 101089233 A | 12/2007 |
| CN | 101298664 A | 11/2008 |

(Continued)

OTHER PUBLICATIONS

Search Report for NL2007809, mailed Feb. 24, 2012.

*Primary Examiner* — Rakesh Dhingra
(74) *Attorney, Agent, or Firm* — Patterson Intellectual Property Law, P.C.; James R. Cartiglia; Bethany J. Whelan

(57) ABSTRACT

The invention relates to an apparatus for performing a plasma chemical vapor deposition process. The apparatus comprises a mainly cylindrical resonator being provided with an outer cylindrical wall enclosing a resonant cavity having a substantially rotational symmetric shape with respect to a cylindrical axis. The resonator further includes side wall portions bounding the resonant cavity in opposite cylindrical axis directions. In addition, the apparatus comprises a microwave guide extending through the outer cylindrical wall into the resonant cavity. The length of the resonant cavity in the cylindrical direction varies as a function of the radial distance to the cylindrical axis.

6 Claims, 2 Drawing Sheets

(56) References Cited

U.S. PATENT DOCUMENTS

| | | | |
|---|---|---|---|
| 2003/0000638 A1* | 1/2003 | Booske et al. | 156/272.2 |
| 2003/0041806 A1 | 3/2003 | Breuls et al. | |
| 2004/0095074 A1* | 5/2004 | Ishii et al. | 315/111.21 |
| 2007/0289532 A1* | 12/2007 | Hartsuiker et al. | 118/723.001 |
| 2008/0226840 A1* | 9/2008 | Asmussen et al. | 427/575 |
| 2009/0266487 A1* | 10/2009 | Tian et al. | 156/345.41 |
| 2012/0186747 A1* | 7/2012 | Obama et al. | 156/345.42 |

FOREIGN PATENT DOCUMENTS

| | | |
|---|---|---|
| DE | 19600223 A1 | 7/1997 |
| EP | 1867610 | 6/2007 |

* cited by examiner

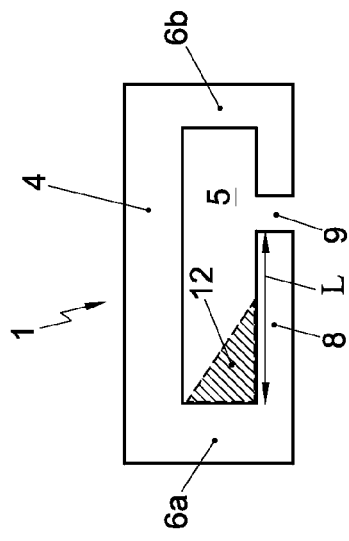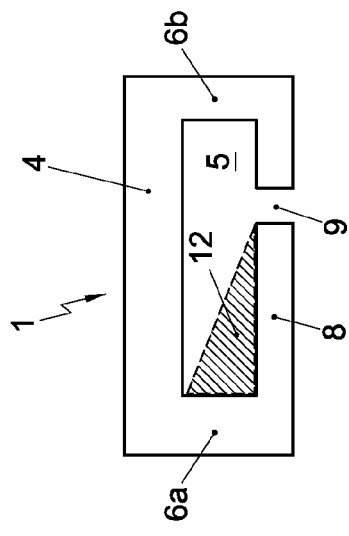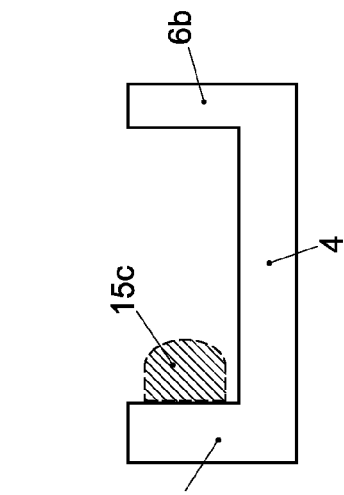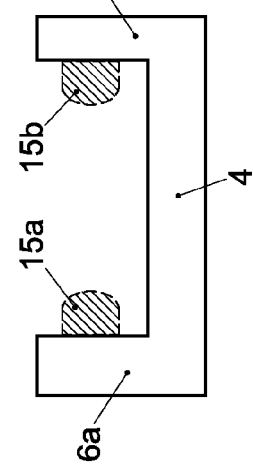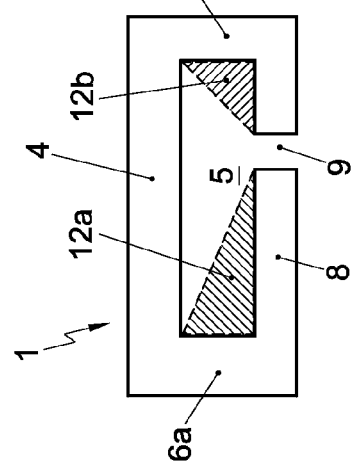

APPARATUS FOR PERFORMING A PLASMA CHEMICAL VAPOUR DEPOSITION PROCESS

The invention relates to an apparatus for performing a plasma chemical vapour deposition process, comprising a mainly cylindrical resonator being provided with an outer cylindrical wall enclosing a resonant cavity having a substantially rotational symmetric shape with respect to a cylindrical axis, the resonator further being provided with side wall portions bounding the resonant cavity in opposite cylindrical axis directions, wherein the apparatus further comprises a microwave guide having an end extending through the outer cylindrical wall into the resonant cavity.

European patent publication EP 1 867 610 in the name of Draka Comteq B. V. discloses such an apparatus for manufacturing an optical fiber.

When applying high power microwave applicators for long lasting processes, problems may arise in terms of load matching due to internal reflections and sensitivity to arcing. If the load is not matched, the whole configuration may become too hot. Then, part of the microwave power may not reach the plasma. Additionally, other equipment, like an autotuner, may also become too hot, leading to malfunctioning or even breakage. Further, if the resonator, also called applicator, is sensitive to arcing, the applicator can not be used properly. During use, damage will then occur at some spots. The arcing process consumes a lot of power, which means that the plasma itself can fade or even switch off temporarily, which has negative consequences for any product that is made by the plasma process.

Related to the load matching issue, it is noted that radial inner rings bounding the cavity in radial directions are in practice too thin to apply a water cooling arrangement therein for cooling the rings.

It is an object of the invention to provide an apparatus according to the preamble, wherein the load matching is improved while the sensitivity to arcing is not increased. Thereto, according to the invention, the length of the resonant cavity in the cylindrical direction varies as a function of the radial distance to the cylindrical axis.

The invention is partly based on the insight that the cavity geometry can be amended to improve the load matching while simultaneously avoiding the occurrence of sharp edges that may induce arcing. By varying the length of the resonant cavity in the cylindrical direction, also mentioned the width of the cavity, as a function of the radial distance to the cylindrical axis, an improved load match can be obtained, while configuration enabling the electromagnetic coupling between the microwave guide and the resonator can be maintained. According to an aspect of the invention, the shape of the cavity is thus amended without introducing additional sharp edges to improve matching and to eliminate any further chance of arcing.

In a particular advantageous embodiment, the resonant cavity is in a cylindrical direction at least partially bounded by the surface of a cone having a longitudinal axis substantially coinciding with the cylindrical axis of the resonator and being tapered towards the opposite side surface of the cavity, so that both the matching and the minimal arcing conditions are met.

Further advantageous embodiments according to the invention are described in the following claims.

By way of example only, embodiments of the present invention will now be described with reference to the accompanying figures in which FIG. 1 shows a schematic cross sectional side view of a first embodiment of an apparatus according to the invention;

FIG. 2a shows a schematic cross sectional side view of a second embodiment of an apparatus according to the invention;

FIG. 2b shows a schematic cross sectional side view of a third embodiment of an apparatus according to the invention;

FIG. 2c shows a schematic cross sectional side view of a fourth embodiment of an apparatus according to the invention;

FIG. 2d shows a schematic cross sectional side view of a fifth embodiment of an apparatus according to the invention; and FIG. 2e shows a schematic cross sectional side view of a sixth embodiment of an apparatus according to the invention.

It is noted that the figures show merely preferred embodiments according to the invention. In the figures, the same reference numbers refer to equal or corresponding parts.

Figure 1:
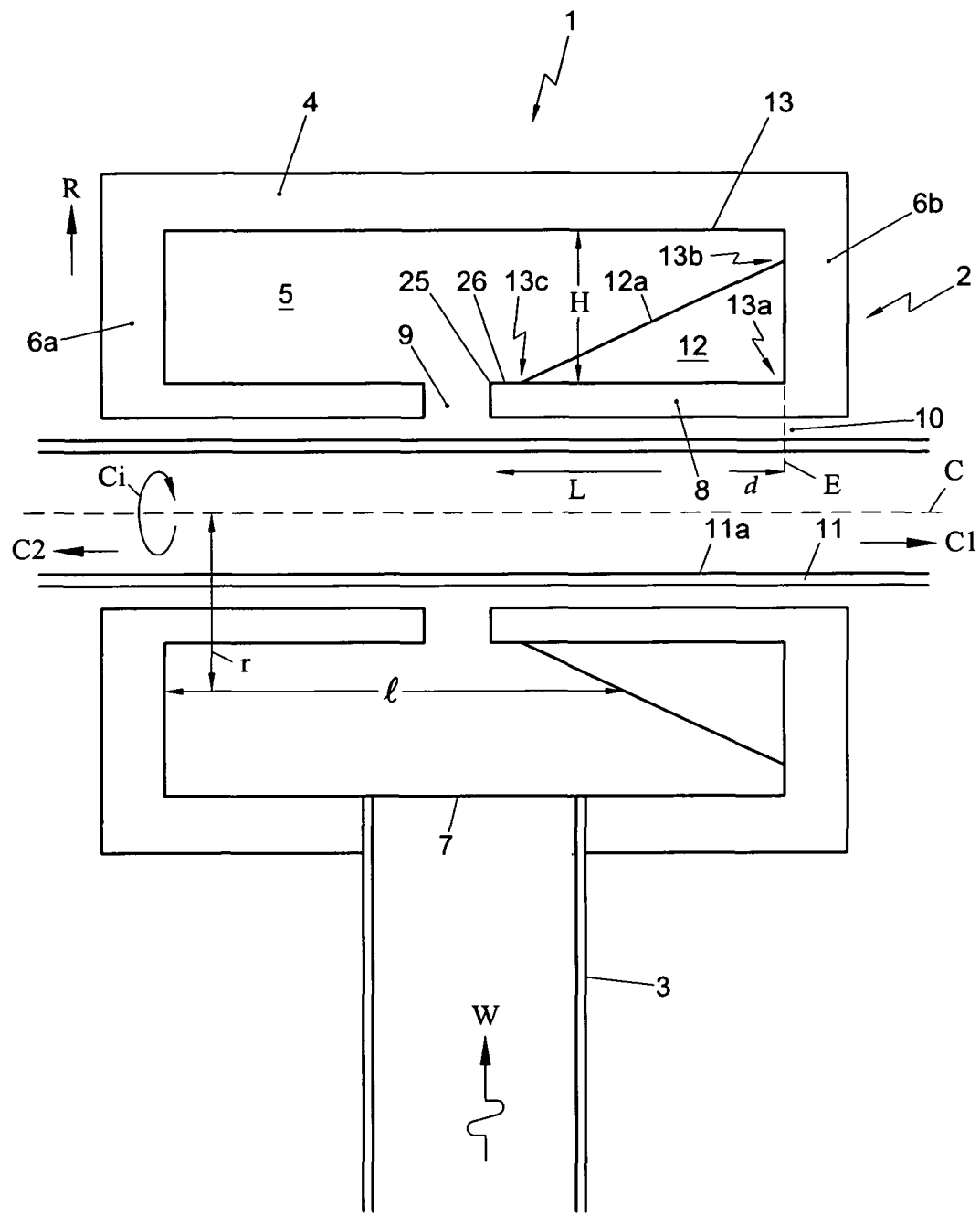

FIG. 1 shows a schematic cross sectional side view of a first embodiment of an apparatus 1 according to the invention. The apparatus 1 comprises a mainly cylindrical resonator 2. The apparatus also comprises a microwave guide 3 for guiding microwaves to the resonator 2. The microwave guide 3 is preferably rectangular shaped so that an optimal interface between the guide 3 and the resonator 2 can be made. The apparatus can be used for performing a plasma chemical vapour deposition process.

The resonator 2 is provided with an outer cylindrical wall 4 enclosing a resonant cavity 5. The cavity has a substantially rotational symmetric shape with respect to a cylindrical axis C. The resonator 2 is further provided with side wall portions 6a,b bounding the resonant cavity 5 in opposite cylindrical axis directions C1, C2.

The microwave guide 3 has an end 7 extending through the outer cylindrical wall 4 into the resonant cavity 5. In the shown embodiment, the resonator 2 further includes an inner cylindrical wall 8 bounding the resonance cavity 5 in a radial direction R towards the cylindrical axis C. In fact, the cavity 5 is thus annular shaped. The inner cylindrical wall 8 has a slit 9 extending in a circumferential direction Ci around the cylindrical axis C. By providing the slit 9, microwave energy may enter, from the resonance cavity 5, into a tubular inner space 10 surrounded by the resonator 2.

In the shown embodiment, a substrate tube 11 has been inserted in the tubular inner space 10.

During operation of the apparatus, microwaves W generated by a microwave generator, such as a magnetron or klystron (not shown), are injected into a second end (also not shown) of the microwave guide 3, also called waveguide, and then guided through the waveguide 3 towards the resonator 2. It is noted that the microwaves may enter the waveguide 3 also in another manner, e.g. via an assembly of additional waveguides. In the resonance cavity 5 microwave energy accumulates and generates a plasma for the purpose of carrying out a plasma chemical vapour deposition (PCVD) process. In the resonance cavity 5 microwave energy entering the cavity from the microwave guide 3 feeds a plasma that is generated inside the substrate tube 11. By conditioning proper gas flows and reciprocating the resonator 2 over the length of the substrate tube 11, glass material is deposited on the inner surface 11a of the substrate tube 11, thereby providing a tube with multiple glass layers deposited on the inside. Such a tube can be contracted to form a solid preform or core rod, which can be further processed for manufacturing a glass fiber.

In order to reduce the sensitivity to arcing, sharp outer edges in the design of the resonator are avoided. A first outer edge is often encountered at the interface between the waveguide 3 and the cavity 5. In the shown embodiment, the width of the cavity, i.e. the internal distance along the cylindrical axis C, mainly equals the corresponding size of the waveguide 3, e.g. a standard measure of 3.4 inch, 86.38 mm, thereby avoiding one outer edge. The difference in width of the cavity 5 and the largest side of the waveguide 3 is preferably small, i.e. smaller than 10 mm, more preferably smaller than 5 mm, and preferably smaller than 1 mm, especially when using power levels above 6 kW. The arcing effect of the other outer edge in the interface can be minimized by rounding the edge.

The output of the cylindrical resonator 2 is typically a slit 9, which in itself is a (radially) small radial waveguide. In principle, the slit 9 can be as wide as the cavity 5 itself or smaller, even down to a few millimeters. The resonator slit 9 forms a radial waveguide extending between the cavity 5 and the inner side of the resonator 2, i.e. the tubular inner space 10.

The resonator 2 includes an annular element 12 defining at least partially a side surface of the cavity 5 in a cylindrical direction C1. In the shown embodiment, the annular element 12 is shaped as a (truncated) cone such that the cone surface 12a has a longitudinal axis substantially coinciding with the cylindrical axis C of the resonator 2 and being tapered towards the opposite side surface of the cavity 5, in the opposite cylindrical direction C2. In other words, the cone 12 is tapered towards the slit 9, so that an inner side surface of the cavity 5 is at least partially shaped as a cone surface. Apparently, the annular element 12 can also be located on the opposite side surface of the cavity 5.

By providing the annular element 12, the length l of the resonant cavity 5 in the cylindrical direction C1 varies as a function of the radial distance r to the cylindrical axis C. In particular, in a certain range of the radial distance r, the cylindrical length l of the cavity 5 increases as a function of increasing radial distance r with respect to the cylindrical axis C. The physical effect of the annular element is that the resonator can be more properly matched with the plasma while sharp edges in the cavity 5 can be avoided, thereby lowering the chance of arcing. Therefore, the surface 12a of the annular element 12 facing the cavity 5 is preferably smooth and the surface ends fit smoothly to the further inner surface of the cavity 5. Further, cooling properties of the resonator increase.

In the shown embodiment, the cavity 5 is basically rectangular shaped, in a cross sectional view, having a height H in the radial direction R and a length between the side wall surfaces in the cylindrical direction C1. The truncated cone 12 fits in a corner of the rectangle so that a right angle 13a of the cavity's inner surface 13 is replaced by two obtuse angles 13b, c. Further, the cone's surface 12a is preferably flat, but may alternatively include smooth deviations, such as a corrugated area and/or curved sections.

The annular element 12 may be formed as a separate element that is located in the resonator 2. The annular element 12 can be fixedly attached to the resonator. Further, the annular element 12 can be integrally formed with further parts of the resonator 2, e.g. with a side wall portion 6 and/or with the inner cylindrical wall 8, to form the cavity 5.

In order not to hamper the introduction of plasma from the cavity 5 into the tubular inner space 10, the slit 9 is not covered by the annular element 12. Thus, an obstruction to the introduction of microwaves into the tubular inner space 10 and the substrate tube 11 is counteracted. In particular, the inner cylindrical wall 8 directly adjacent to the slit 9 forms part of the cavity's inner surface 13. In the shown embodiment, the radial inner surface of the cavity is substantially parallel to the cylindrical axis C in a region 26 adjacent to the slit 9 up to a certain distance. However, the inner facing surface 12a of the annular element 12 may extend up to the edge 25 of the slit 9.

Preferably, the annular element 12 fills a part of a volume bounded in the radial direction R between the inner cylindrical wall 8 and the outer cylindrical wall 4 and in a cylindrical direction C1 between a side wall portion 6b and the slit edge 25, wherein the volume part that is filled by the annular element 12 is in a range of circa 10% to circa 95%. In the shown embodiment, the annular element 12 is located at the right hand side of the slit edge 25 at the right hand side of the slit 9. The volume has in the cross sectional view a length L in the cylindrical direction C1 and a height H in the radial direction R. The annular element 12 is placed at the inner cylindrical wall 8 and the right hand side wall portion 6b.

If the annular element 12 would be designed to cover more than 95% of said volume at the right or left to the slit, the incident microwaves W might be hindered. Otherwise, if the annular element 12 would be designed to cover less than 10% of said volume, the effect of the annular element 12 is minimal.

Advantageously, the side surface 13 of the cavity extends, at a longitudinal end E of the cavity 5, substantially perpendicular with respect to the cylindrical axis C, preferably along a distance d of at least circa 1 mm, preferably near the outer cylindrical wall 4, so that the annular element 12 fits well in the resonator 2, and construction problems during the manufacturing process of the resonator 2 are counteracted.

The resonator may include further modules accommodating the components described above. Further, the cavity's inner surface is at least partly electrically conductive. Therefore, the walls are preferably made from metallic material such as steel.

FIGS. 2a-e show a schematic cross sectional side view of a second, third, fourth and fifth embodiment, respectively, of an apparatus according to the invention.

FIG. 2a shows in a more simplified form a cavity's configuration that is almost similar to the apparatus shown in FIG. 1. The annular shaped cavity 5 is surrounded, when seen in a cross sectional view, by an outer cylindrical wall 4, two side wall portions 6a,b and an inner cylindrical wall 8 provided with a slit 9. Compared to the configuration shown in FIG. 1, the annular element 12 is now placed against the opposite side wall portion 6a.

In FIG. 2b, the annular element 12 occupies a smaller percentage of the volume bounded between the inner cylindrical wall 8, the outer cylindrical wall 4, a side wall portion 6a and the slit 9.

FIG. 2c shows a cavity's configuration including a pair of annular elements 12a,b placed at opposite sides with respect to the slit 9.

In FIGS. 2d and 2e, the resonator is provided without the inner cylindrical wall 8. Here, the annular elements 12 are formed as a pair of rounded rings 15a, b placed next to the opposite side wall portions 6a,b, see FIG. 2d, or as a single rounded ring 15c placed next to a side wall portion 6a, see FIG. 2e.

The invention is not restricted to the embodiments described herein. It will be understood that many variants are possible.

It is noted that the annular element is preferably symmetric with respect to the cylindrical axis C of the resonator 2. However, in principle, the geometry might deviate, e.g. by providing an annular segment that does not entirely enclose the tubular inner space 10, but merely a circumferential part thereof.

It is also noted that a specific shape of the annular element is not related to the aspect whether an inner cylindrical wall is applied, or not.

It is further noted that the annular element that is arranged in the resonator can be optimized for a specific application. Alternatively, the resonator can be formed on a modular basis, so that a specific annular elements from a range of annular elements can be selected that is suitable for a specific use of the resonator, thereby rendering the apparatus configurable for a wide variety of applications.

Other such variants will be apparent for the person skilled in the art and are considered to fall within the scope of the invention as defined in the following claims.

What is claimed is:

1. An apparatus for performing a plasma chemical vapor deposition process, comprising
   a mainly cylindrical resonator being provided with an outer cylindrical wall enclosing an annular resonant cavity having a substantially rotational symmetric shape with respect to a cylindrical axis,
   the resonator further being provided with side wall portions bounding the resonant cavity in opposite cylindrical axis directions,
   wherein the apparatus further comprises a microwave guide having an end extending through the outer cylindrical wall into the resonant cavity, and
   wherein the length of the resonant cavity in the cylindrical direction varies as a function of a the radial distance to the cylindrical axis,
   wherein the resonator includes an annular element defining at least partially a side surface of the cavity in a cylindrical direction,
   wherein the apparatus is further provided with an inner cylindrical wall bounding the resonance cavity in a radial direction towards the cylindrical axis, and
   wherein the inner cylindrical wall has a slit extending in a circumferential direction around the cylindrical axis, and wherein the annular element fills a part of a volume bounded in the radial direction between the inner cylindrical wall and the outer cylindrical wall and in a cylindrical direction between a side wall portion and a slit edge,
   wherein the volume part that is filled by the annular element is in a range of circa 10% to circa 95%.

2. An apparatus according to claim 1, wherein the resonant cavity is in a cylindrical direction at least partially bounded by a cone shaped surface of the annular element having a longitudinal axis substantially coinciding with the cylindrical axis of the resonator and being tapered towards an opposite side surface of the cavity.

3. An apparatus according to claim 1, wherein, in a certain range, the cylindrical length of the cavity increases as a function of increasing radial distance with respect to the cylindrical axis.

4. An apparatus according to claim 1, wherein the annular element is integrated with a side wall portion and/or the inner cylindrical wall of the resonator.

5. An apparatus according to claim 1, wherein, at a longitudinal end of the cavity, the side surface of the cavity extends substantially perpendicular with respect to the cylindrical axis, preferably along a distance of at least circa 1 mm.

6. An apparatus according to claim 1, further comprising a microwave generator connector to a second end of the microwave guide.

* * * * *